(12) United States Patent
Mathiowetz et al.

(10) Patent No.: US 7,036,386 B2
(45) Date of Patent: May 2, 2006

(54) MULTIPURPOSE UTILITY MOUNTING ASSEMBLY FOR HANDHELD FIELD MAINTENANCE TOOL

(75) Inventors: Brad N. Mathiowetz, Lakeville, MN (US); Joachim Düren, Cologne (DE); Heiner Gerken, Schortens (DE)

(73) Assignee: Fisher-Rosemount Systems, Inc., Austin, TX (US)

( * ) Notice: Subject to any disclaimer, the term of this patent is extended or adjusted under 35 U.S.C. 154(b) by 52 days.

(21) Appl. No.: 10/440,444

(22) Filed: May 16, 2003

(65) Prior Publication Data

US 2004/0226385 A1 Nov. 18, 2004

(51) Int. Cl.
*G01N 3/02* (2006.01)
(52) U.S. Cl. .......................................... 73/856; 73/855
(58) Field of Classification Search .......... 73/856–860, 73/855
See application file for complete search history.

(56) References Cited

U.S. PATENT DOCUMENTS

| | | | | |
|---|---|---|---|---|
| 3,774,693 A | * | 11/1973 | Orthman | 172/311 |
| 4,290,647 A | * | 9/1981 | Hensel et al. | 297/362 |
| 4,337,516 A | | 6/1982 | Murphy et al. | 364/551 |
| 4,535,636 A | * | 8/1985 | Blackburn et al. | 73/831 |
| 4,630,265 A | | 12/1986 | Sexton | 370/86 |
| 4,630,483 A | * | 12/1986 | Engdahl | 73/652 |
| 4,635,214 A | | 1/1987 | Kasai et al. | 364/551 |
| 4,707,796 A | | 11/1987 | Calabro et al. | 364/552 |
| 4,954,923 A | | 9/1990 | Hoeflich et al. | 361/111 |
| 4,964,125 A | | 10/1990 | Kim | 371/15.1 |
| 4,988,990 A | | 1/1991 | Warrior | 340/25.5 |
| 5,005,142 A | | 4/1991 | Lipchak et al. | 364/550 |
| 5,099,539 A | * | 3/1992 | Forester | 15/144.3 |
| 5,103,409 A | | 4/1992 | Shimizu et al. | 364/556 |
| 5,113,303 A | | 5/1992 | Herres | 361/45 |
| 5,148,378 A | | 9/1992 | Shibayama et al. | 364/571.07 |
| 5,150,289 A | | 9/1992 | Badavas | 364/154 |
| 5,197,328 A | | 3/1993 | Fitzgerald | 73/168 |
| 5,426,774 A | | 6/1995 | Banerjee et al. | 395/575 |
| 5,434,774 A | | 7/1995 | Seberger | 364/172 |
| 5,442,639 A | | 8/1995 | Crowder et al. | 371/20.1 |
| 5,469,156 A | | 11/1995 | Kogure | 340/870.38 |
| 5,471,698 A | * | 12/1995 | Francis et al. | 15/144.1 |
| 5,481,200 A | | 1/1996 | Voegele et al. | 324/718 |
| 5,501,107 A | * | 3/1996 | Snyder et al. | 73/862.23 |
| 5,570,300 A | | 10/1996 | Henry et al. | 364/551.01 |

(Continued)

FOREIGN PATENT DOCUMENTS

DE 29917651 12/2000

(Continued)

OTHER PUBLICATIONS

U.S. Appl. No. 09/384,876, filed Aug. 27, 1999, Eryurek et al.

(Continued)

*Primary Examiner*—Max Noori
*Assistant Examiner*—Alandra Ellington
(74) *Attorney, Agent, or Firm*—Westman, Champlin & Kelly, P.A.

(57) ABSTRACT

A multipurpose utility mounting assembly for a handheld field maintenance tool is disclosed. The assembly includes a number of features that allow effective use of the handheld field maintenance tool for a wide variety of mounting techniques that may be encountered in the field. Specifically, the mounting assembly includes features that facilitate handheld use, benchtop use and temporary hanging use. In some embodiments, the multipurpose utility mounting assembly is detachably mountable to a handheld field maintenance tool.

18 Claims, 4 Drawing Sheets

U.S. PATENT DOCUMENTS

| | | | | |
|---|---|---|---|---|
| 5,573,032 | A | 11/1996 | Lenz et al. | 137/486 |
| 5,581,033 | A * | 12/1996 | Hess | 73/431 |
| 5,598,521 | A | 1/1997 | Kilgore et al. | 395/326 |
| 5,623,605 | A | 4/1997 | Keshav et al. | 395/200.17 |
| 5,665,899 | A | 9/1997 | Willcox | 73/1.63 |
| 5,697,453 | A * | 12/1997 | Van Den Bosch | 172/41 |
| 5,742,845 | A | 4/1998 | Wagner | 395/831 |
| 5,752,249 | A | 5/1998 | Macon, Jr. et al. | 707/103 |
| 5,764,891 | A | 6/1998 | Warrior | 395/200.2 |
| 5,828,567 | A | 10/1998 | Eryurek et al. | 364/184 |
| 5,838,187 | A | 11/1998 | Embree | 327/512 |
| 5,909,368 | A | 6/1999 | Nixon et al. | 364/131 |
| 5,923,557 | A | 7/1999 | Eidson | 364/471.03 |
| 5,940,290 | A | 8/1999 | Dixon | 364/138 |
| 5,956,663 | A | 9/1999 | Eryurek | 702/183 |
| 5,960,214 | A | 9/1999 | Sharpe, Jr. et al. | 395/835 |
| 5,970,430 | A | 10/1999 | Burns et al. | 702/122 |
| 5,980,078 | A | 11/1999 | Krivoshein et al. | 364/131 |
| 5,995,916 | A | 11/1999 | Nixon et al. | 702/182 |
| 6,017,143 | A | 1/2000 | Eryurek et al. | 364/148.06 |
| 6,023,399 | A | 2/2000 | Kogure | 364/23 |
| 6,026,352 | A | 2/2000 | Burns et al. | 702/182 |
| 6,047,222 | A | 4/2000 | Burns et al. | 700/79 |
| 6,052,655 | A | 4/2000 | Kobayashi et al. | 702/184 |
| 6,085,576 | A * | 7/2000 | Sunshine et al. | 73/29.01 |
| 6,091,968 | A | 7/2000 | Koohgoli et al. | 455/557 |
| 6,094,600 | A | 7/2000 | Sharpe, Jr. et al. | 700/19 |
| 6,111,738 | A | 8/2000 | McGoogan | 361/91.5 |
| 6,119,047 | A | 9/2000 | Eryurek et al. | 700/28 |
| 6,179,964 | B1 | 1/2001 | Begemann et al. | 162/198 |
| 6,192,281 | B1 | 2/2001 | Brown et al. | 700/2 |
| 6,195,591 | B1 | 2/2001 | Nixon et al. | 700/83 |
| 6,211,623 | B1 | 4/2001 | Wilhelm et al. | 315/224 |
| 6,236,334 | B1 | 5/2001 | Tapperson et al. | 340/825.37 |
| 6,263,487 | B1 | 7/2001 | Stripf et al. | 717/1 |
| 6,270,920 | B1 | 8/2001 | Nakanishi et al. | 429/163 |
| 6,298,377 | B1 | 10/2001 | Hartkainen et al. | 709/223 |
| 6,304,934 | B1 | 10/2001 | Pimenta et al. | 710/129 |
| 6,307,483 | B1 | 10/2001 | Westfield et al. | 340/870.11 |
| 6,317,701 | B1 | 11/2001 | Pyotsia et al. | 702/188 |
| 6,324,607 | B1 | 11/2001 | Korowitz et al. | 710/102 |
| 6,356,191 | B1 | 3/2002 | Kirkpatrick et al. | 340/501 |
| 6,370,448 | B1 | 4/2002 | Eryurek | 700/282 |
| 6,377,859 | B1 | 4/2002 | Brown et al. | 700/79 |
| 6,397,114 | B1 | 5/2002 | Eryurek et al. | 700/51 |
| 6,434,504 | B1 | 8/2002 | Eryurek et al. | 702/130 |
| 6,444,350 | B1 | 9/2002 | Toya et al. | 429/90 |
| 6,449,574 | B1 | 9/2002 | Eryurek et al. | 702/99 |
| 6,473,710 | B1 | 10/2002 | Eryurek | 702/133 |
| 6,487,462 | B1 | 11/2002 | Reeves | 700/73 |
| 6,505,517 | B1 | 1/2003 | Eryurek et al. | 73/861.08 |
| 6,519,546 | B1 | 2/2003 | Eryurek et al. | 702/130 |
| 6,532,392 | B1 | 3/2003 | Eryurek et al. | 700/54 |
| 6,539,267 | B1 | 3/2003 | Eryurek et al. | 700/51 |
| 6,594,603 | B1 | 7/2003 | Eryurek et al. | 702/104 |
| 6,594,621 | B1 | 7/2003 | Meeker | 702/185 |
| 6,598,828 | B1 | 7/2003 | Fiebick et al. | 244/118.1 |
| 6,601,005 | B1 | 7/2003 | Eryurek et al. | 702/104 |
| 6,611,775 | B1 | 8/2003 | Coursolle et al. | 702/65 |
| 6,615,149 | B1 | 9/2003 | Wehrs | 702/76 |
| 6,629,059 | B1 | 9/2003 | Borgeson et al. | 702/183 |
| 6,654,697 | B1 | 11/2003 | Eryurek et al. | 702/47 |
| 6,697,681 | B1 | 2/2004 | Stoddard et al. | 700/17 |
| 6,714,969 | B1 | 3/2004 | Klein et al. | 709/219 |
| 6,733,376 | B1 * | 5/2004 | Williams | 451/344 |
| 6,748,631 | B1 * | 6/2004 | Iguchi et al. | 24/265 WS |
| 2001/0053065 | A1 | 12/2001 | Cudini et al. | 361/728 |
| 2002/0004370 | A1 | 1/2002 | Stengele et al. | |
| 2002/0065631 | A1 | 5/2002 | Loechner | |
| 2002/0077711 | A1 | 6/2002 | Nixon et al. | |
| 2002/0123864 | A1 | 9/2002 | Eryurek et al. | |
| 2003/0023408 | A1 | 1/2003 | Wight et al. | |
| 2003/0023795 | A1 | 1/2003 | Packwood et al. | |
| 2003/0033040 | A1 | 2/2003 | Billings | 700/97 |
| 2003/0158795 | A1 | 8/2003 | Markham et al. | |
| 2004/0230327 | A1 | 11/2004 | Opheim et al. | 700/83 |

FOREIGN PATENT DOCUMENTS

| | | |
|---|---|---|
| DE | 1993 0660 A1 | 1/2001 |
| EP | 1022626 A2 | 7/2000 |
| GB | 2347232 | 8/2000 |
| JP | 2753592 | 1/1990 |
| JP | 2001/070224 | 3/2001 |
| JP | 2001070224 A * | 3/2001 |
| WO | WO/96/12993 | 5/1996 |
| WO | WO/97/21157 | 6/1997 |
| WO | WO/98/14855 | 10/1997 |
| WO | WO/98/39718 | 9/1998 |
| WO | WO/00/41050 | 7/2000 |
| WO | WO 00/55700 | 9/2000 |
| WO | WO/02/027418 | 4/2002 |

OTHER PUBLICATIONS

U.S. Appl. No. 09/409,098, filed Sep. 30, 1999, Eryurek et al.
U.S. Appl. No. 09/799,824, filed Mar. 5, 2001, Rome et al.
U.S. Appl. No. 09/852,102, filed May 9, 2001, Eryurek et al.
U.S. Appl. No. 09/855,179, filed May 14, 2001, Eryurek et al.
U.S. Appl. No. 10/790,627, filed Mar. 6, 2003, Mathiowetz.
U.S. Appl. No. 10/438,386, filed Mar. 1, 2004, Mathiowetz et al.
U.S. Appl. No. 10/440,047, filed May 16, 2003, Kantzes et al.
U.S. Appl. No. 10/426,894, filed Apr. 30, 2003, Duren et al.
U.S. Appl. No. 10/438,401, filed May 16, 2003, Opheim et al.
U.S. Appl. No. 10/440,434, filed May 16, 2003, DelaCruz et al.
U.S. Appl. No. 10/435,819, filed May 12, 2003, Kantzes et al.
U.S. Appl. No. 10/440,048, filed May 16, 2003, Duren et al.
U.S. Appl. No. 10/440,444, filed May 16, 2003, Mathiowetz et al.
U.S. Appl. No. 10/439,660, filed May 16, 2003, Mathiowetz et al.
U.S. Appl. No. 10/439,764, filed May 16, 2003, Mathiowetz.
U.S. Appl. No. 10/310,703, filed Dec. 5, 2002, Zielinski et al.
U.S. Appl. No. 10/440,041, filed May 16, 2003, Mathiowetz et al.
U.S. Appl. No. 10/440,441, filed May 16, 2003, Mathiowetz et al.
Fluke 179 Multimeter & ToolPak Combo Pack, http://www.fluke.com/MULTIMETER/TOOLPAK.ASP?AGID=6&SID=260 (2 pages).
"Multifunction PDA Calibrator Transmation Model 3-PMF1," Transmation, Apr. 2001.
"AAPA 60 & 90 Series Multimeter," http://www.appatech.com/a-60new.htm (5 pages).
"Fieldbus Standard for Use in Industrial Control Systems Part 2: Physical Layer Specification and Service Definition", ISA-S50.02-1992, pp. 1-93.
Hart Communications, Technical Information, Part 4 Communications, Samson, Frankfurt.
"Fieldbus Brings Protocol to Process Control," Santori et al., IEEE Spectrum, vol. 33, Issue 3, Mar. 1996, pps. 60-64.
"Computerized Maintenance systems-an Overview of Two Basic Types for Field Devices," Medlin, IEEE Pulp and Pater Industry Technical Conference, Jun. 21-25, 1999, pps. 230-232.

"Fieldbus in the Process Control Laboratory-its Time has Come," Rehg. et al., ASEE/IEEE Frontiers in Education Conference, vol. 3, Nov. 1999, pps. 13B4/12-13B4/17.

"Generic Device Description for Complex HART Field Devices," Zulkifi et al., IEE 8th International Conference on Communication Systems, vol. 2, Nov. 25-28, 2002, pps. 646-650.

"SFC Smart Field Communicator-Model STS103," Honeywell, Specification, Dec. 1995, pps. 1-4.

"SFC Smart Field Communicator-Models SFC160/SFC260," Yamatake, Specification Apr. 1999, pps. 1-6.

"HART Communicator," Fisher-Rosemount, Product Manual, Jul. 2000, pps. i-iv, ix-x, 1-1-1-40—2-1-2-8—3-1-3-38—A-1-A-6—B-1-B-6—C-1-C-4—D-1-D-4 and I-1 1-2.

Shoji et al., Fieldbus System Engineering, 1999, Yokogawa Technical Report.

Diedrich et al., Field Device Integration in DCS Engineering Using a Device Model, 1998, IEEE.

"HART Communicator," Asset Management Solutions, Fisher-Rosemount, Bulletin 62.1: Communicator, Jan. 2001, pp. 1-7.

\* cited by examiner

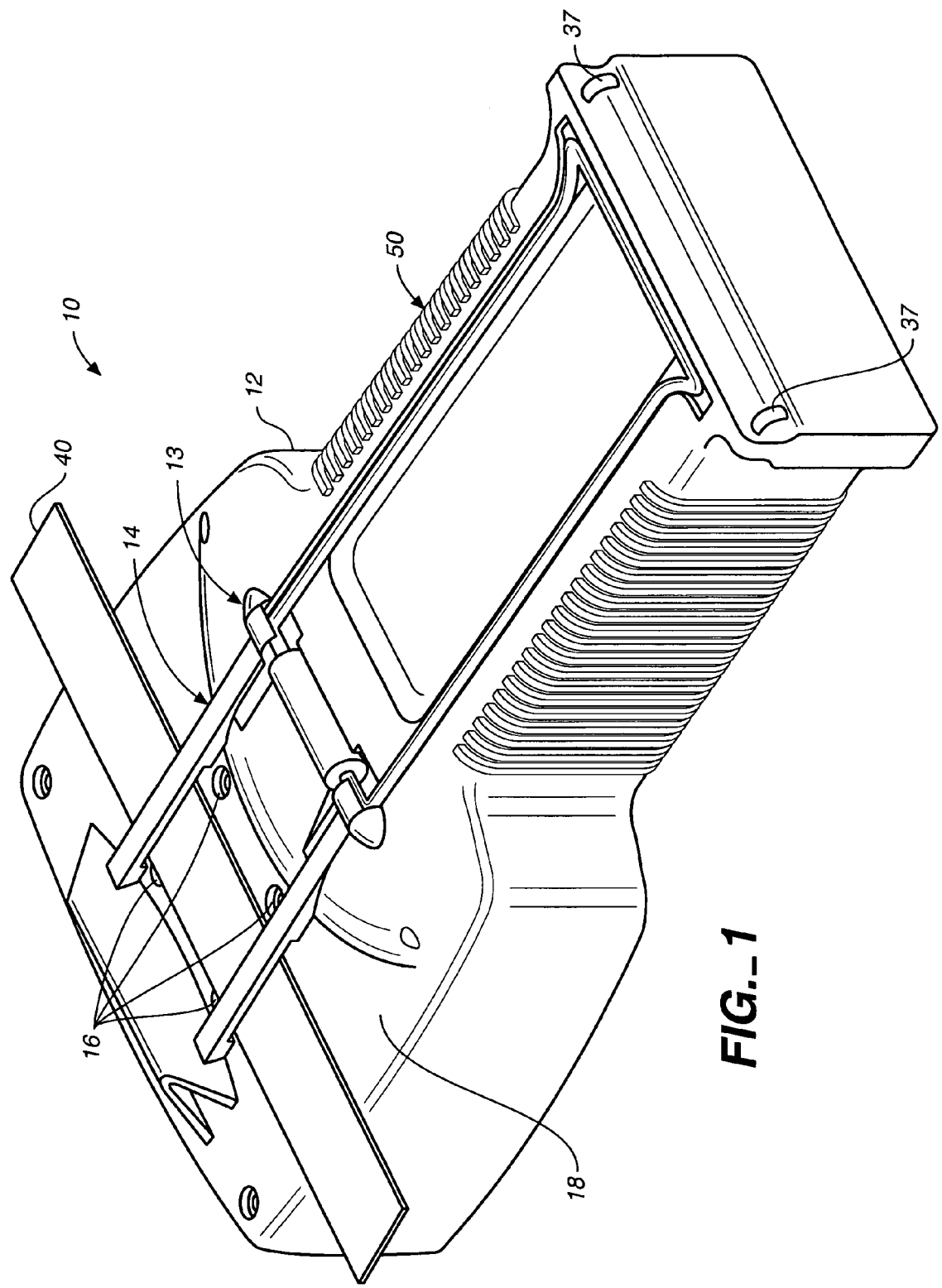
FIG._1

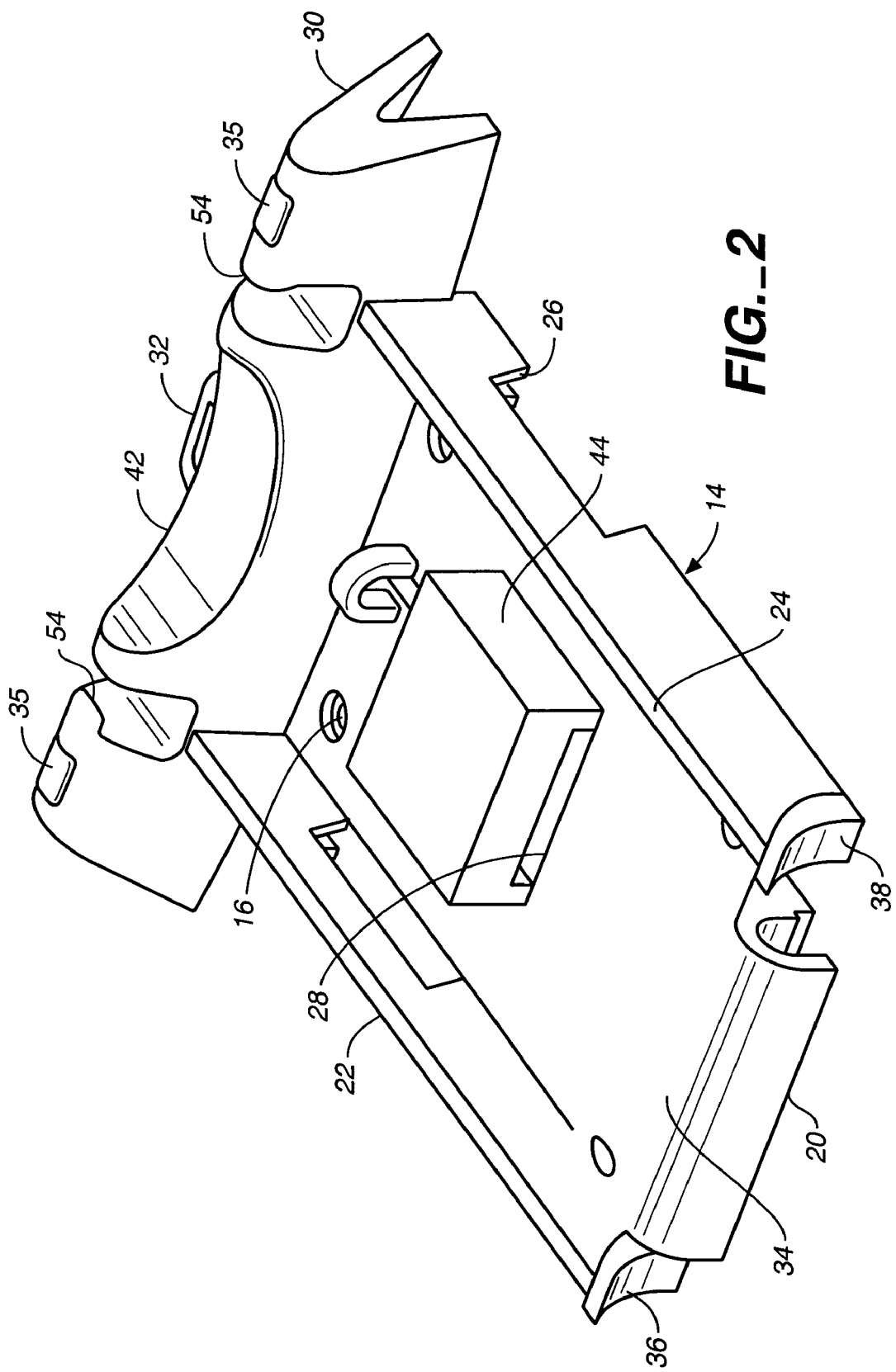
FIG._2

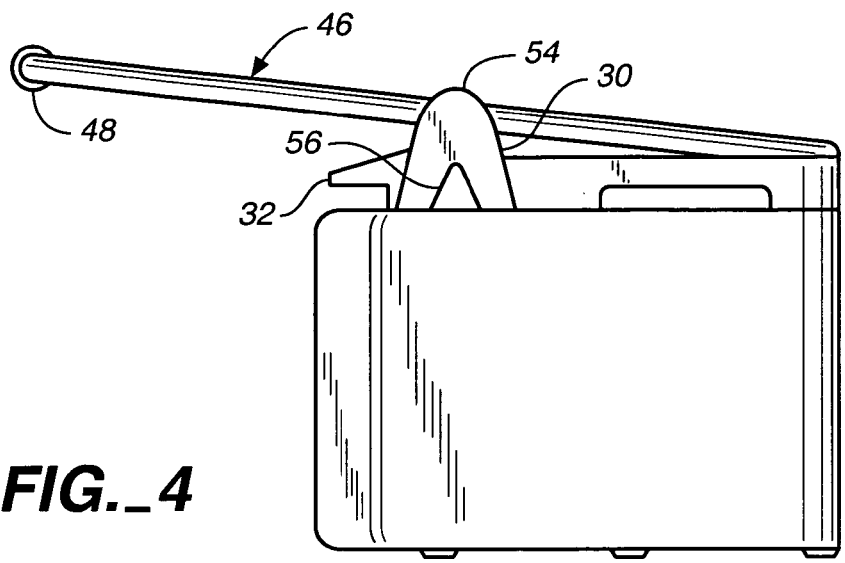
FIG._4
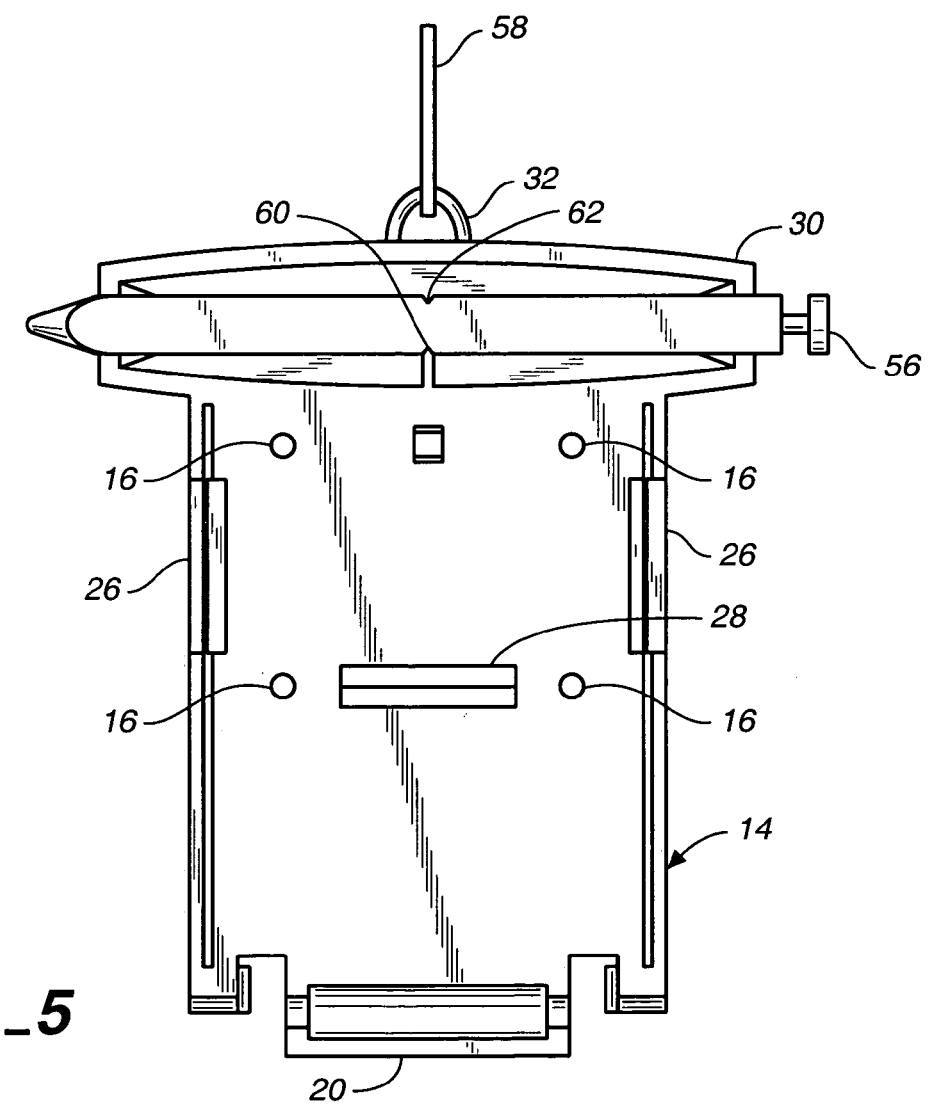
FIG._5

MULTIPURPOSE UTILITY MOUNTING ASSEMBLY FOR HANDHELD FIELD MAINTENANCE TOOL

BACKGROUND OF THE INVENTION

Handheld field maintenance tools are known. Such tools are highly useful in the process control and measurement industry to allow operators to conveniently communicate with and/or interrogate field devices in a given process installation. Examples of such process installations include petroleum, pharmaceutical, chemical, pulp and other processing installations. In such installations, the process control and measurement network may include tens or even hundreds of various field devices which periodically require maintenance to ensure that such devices are functioning properly and/or calibrated. Moreover, when one or more errors in the process control and measurement installation is detected, the use of a handheld field maintenance tool allows technicians to quickly diagnose such errors in the field.

One such device is sold under the trade designation Model 275 HART® Communicator available from Fisher-Rosemount Systems, Inc., of Eden Prairie, Minn. HART® is a registered trademark of the HART® Communication Foundation. The Model 275 provides a host of important functions and capabilities and generally allows highly effective field maintenance. Field maintenance tools, such as the model 275, are used extensively by field technicians in a number of contexts. First, field technicians will actually carry the handheld tool into the field and use it to interact with field devices. Additionally, technicians will also use the handheld tool in the laboratory to interact with field devices while on a laboratory benchtop, for example. Finally, there may be some instances in the field where a technician must use both hands in order to effectively interact with a field device. In these circumstances, it is desirable to allow the handheld tool to be mountable to any of a variety of surfaces that are encountered in the field. Providing handheld field maintenance tools with the ability to be easily mounted and/or utilized in these varying circumstances would vastly facilitate the utility of such tools. Moreover, providing such features in a manner that could be added or removed to/from the tool as needed by the technician would also be desirable.

SUMMARY OF THE INVENTION

A multipurpose utility mounting assembly for a handheld field maintenance tool is disclosed. The assembly includes a number of features that allow effective use of the handheld field maintenance tool for a wide variety of mounting techniques that may be encountered in the field. Specifically, the mounting assembly includes features that facilitate handheld use, benchtop use and temporary hanging use. In some embodiments, the multipurpose utility mounting assembly is detachably mountable to a handheld field maintenance tool.

BRIEF DESCRIPTION OF THE DRAWINGS

FIG. 1 is a bottom perspective view of a handheld field maintenance tool and multipurpose utility mounting assembly mounted thereto, in accordance with embodiments of the present invention.

FIG. 2 is a bottom perspective view of a multipurpose utility plate for a handheld field maintenance tool in accordance with embodiments of the present invention.

FIG. 4 is a diagrammatic view of a stand in a hanger position in accordance with embodiments of the present invention.

FIG. 5 is a bottom plan cutaway view of a multipurpose utility mounting assembly for a handheld field maintenance tool in accordance with embodiments of the present invention.

DETAILED DESCRIPTION OF THE PREFERRED EMBODIMENTS

Figure 3B:
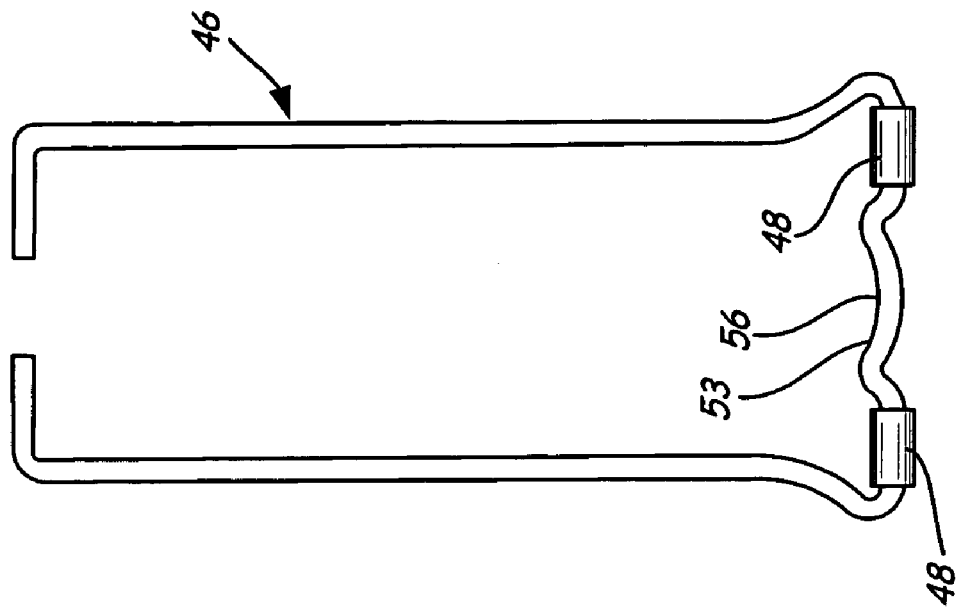
FIGS. 3A and 3B are diagrammatic views of a stand for use with a multipurpose utility mounting assembly for a handheld field maintenance tool in accordance with embodiments of the present invention.

While various embodiments of the present invention will be described with respect to a handheld field maintenance tool product to be available from Fisher-Rosemount Systems, Inc. embodiments of the present invention can be practiced with any handheld field maintenance tool. As used herein, "field maintenance tool" includes any device capable of communicating with a field device either on a benchtop, or in the field, in accordance with a process industry standard protocol. Examples of such protocols include the Highway Addressable Remote Transducer (HART®) protocol and the FOUNDATION™ fieldbus process communication protocol.

FIG. 1 is a bottom perspective view of a handheld field maintenance tool 12 and multipurpose utility mounting assembly 13 mounted thereto. Assembly 13 includes multipurpose utility plate 14 and stand 46. Multipurpose utility plate 14 is preferably releasably coupled to handheld field maintenance tool 12. One manner in which this releasable coupling can be achieved is by virtue of through-holes 16 which allow screws to pass therethrough to couple multipurpose utility plate 14 to the underside 18 of handheld tool 12. While screws and through-holes are the preferred method of releasably coupling multipurpose utility plate 14 to tool 12, many other techniques can be employed. For example, multipurpose utility plate 14 may include a number of apertures which cooperate with deflectable features on surface 18 such that multipurpose utility plate 14 can be snapped onto tool 12. Alternatively, the plate 14 could be integrally formed with the back of the tool. Preferably, multipurpose utility plate 14 is constructed from a material that facilitates low-cost manufacture, such as injection moldable plastic. However, any suitable material may be used to construct multipurpose utility plate 14. In one embodiment, utility plate 14 includes hinge portion 20, struts 22, 24, transverse slot 26, longitudinal slot 28, stylus portion 30 and wrist strap loop 32.

FIG. 2 illustrates four countersunk screw holes 16 extending through backing plate 34. Struts 22 and 24 extend from feet 36 and 38, respectively, to stylus portion 30. Each of struts 22, 24 includes a cutout region which defines transverse loop slot 26. An exemplary portion of a transverse loop 40 is illustrated in FIG. 1 passing through transverse loop portion 26. Transverse loop portion 26 and the transverse loop 40 associated therewith facilitate attaching handheld field maintenance tool 12 to a longitudinal surface, such as a vertical pipe. For horizontal surfaces such as round pipes, a stylus portion 30 is shaped with a circular cross-section in order to better secure mounting plate 14 to a vertical pipe. This geometry is illustrated at reference numeral 42 in FIG. 2. To secure mounting plate 14 to a transverse pipe or other similar structure, longitudinal mounting slot 28 is provided in the form of raised pedestal 44 which allows a loop to pass therethrough and be secured around a suitable structure. The combination of both a transverse loop portion and a vertical or longitudinal loop portion provide substantial flexibility for temporarily mounting handheld field maintenance tool 12 to any suitable structure found in the field.

FIG. 2 also illustrates elastomeric feet 35 disposed proximate stylus region 30. Additionally, as illustrated in FIG. 1, handheld field maintenance tool 12 also includes a pair of elastomeric feet 37 disposed near a bottom region thereof. Thus, when stand 46 is disposed in a retracted position, tool 12 is able to be laid flat upon a horizontal surface such that tool 12 rests on all four elastomeric feet 35, 37.

Figure 3A:
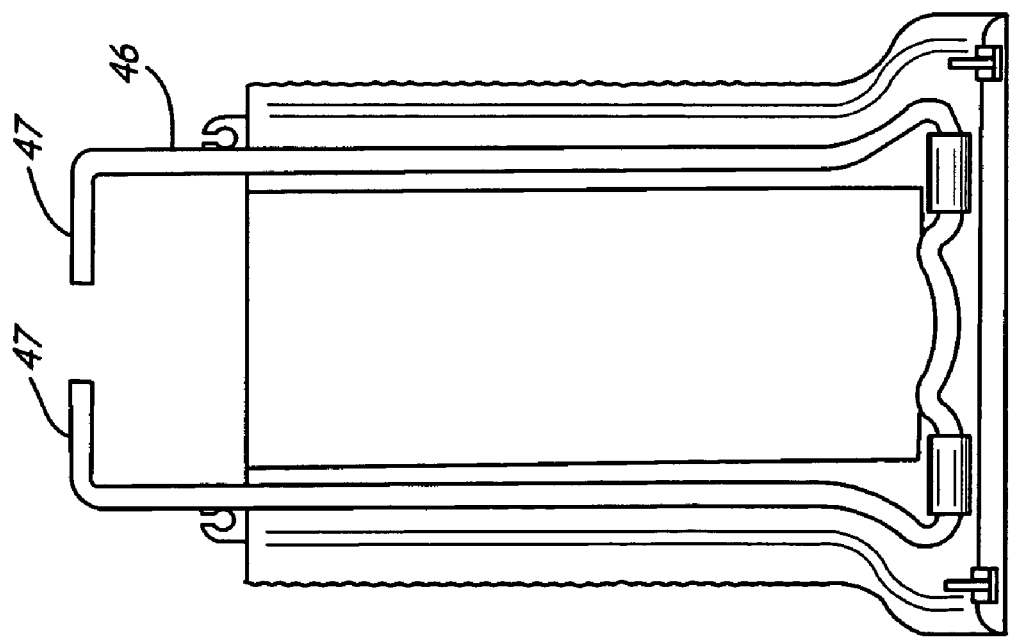

FIGS. 3A and 3B illustrate a stand usable with the multipurpose mounting plate and handheld field maintenance tool illustrated in FIGS. 1 and 2. Specifically, FIG. 3A illustrates stand 46 disposed in a retracted position wherein the stand, which is generally a u-shape having 90 degree ends 47, is disposed within a recess in the handle portion 50 of tool 12. FIG. 3B illustrates preferred features of stand 46. Stand 46 includes a pair of elastomeric feet 48 disposed about the preferably circular cross-section of stand 46. Additionally, the shape of stand 46 between feet 48 preferably includes a local minima, such as a curve 53 having minima 56. However, other suitable shapes can be practiced in accordance with embodiments of the present invention.

When fully assembled, ends 47 of stand 46 are captured within hinge portion 20 of multipurpose mounting plate 14. This allows stand 46 to pivot about hinge 20 and to extend above the top of plate 14 (near wrist strap loop 32) to create a convenient point upon which stand 46 can be hung upon any post, peg, pin or other suitable structure found in the field.

Hinge region 20 is preferably configured to resist bending, but is not so inflexible so that it will not give if excessive force is used. Specifically, this means that the material selection and thickness of hinge region 20 is such that if excessive force is used when stand 46 is in an intermediate position, between the retracted an hanger positions, that hinge region 20 will break before any other portion of the mounting plate 14 or tool 12. This ensures that the handheld field maintenance tool remains undamaged in the event of such excessive force.

Preferably, stand 46 is positionable in different orientations. For example, stand 46 is positionable in the retracted position shown in FIG. 1, the hanger position shown in FIG. 4, and an intermediate position wherein stand 46 is swung out until it runs into a stop that is an integral part of hinge 20. The angle of this predetermined stop is fixed during design and is created such that the angle is best suited for use of the handheld field maintenance tool for optimum viewing when placed on a horizontal surface. Preferably, when stand 46 is disposed in the hanger position, illustrated in FIG. 4, stand 46 passes interference tangs 54 which serve to keep stand 46 in the hanger position. This creates additional stability for tool 12 when so mounted.

FIG. 5 is a bottom plan cut-away view of utility mounting plate 14 in accordance with an embodiment of the present invention. FIG. 5 further illustrates a number of features that have been described already. However, FIG. 5 also shows further definition with respect to wrist strap mounting loop 32 which is shown in FIG. 5 as coupling to wrist strap 58. Additionally, while other figures have illustrated stylus 56 disposed in stylus region 30 of mounting plate 14, FIG. 5 shows an additional preferred feature. Specifically, stylus 56 and a portion 60 within region 30 preferably cooperate to create a slight interference such that when stylus 56 is positioned sufficiently far within region 30, portion 60 will fit within a complementary portion 62 of stylus 56 to thereby retain stylus 56 within stylus region 30. However, those skilled in the art will recognize that any number of suitably cooperating features can be used to maintain stylus 56 within region 30.

Although the present invention has been described with reference to preferred embodiments, workers skilled in the art will recognize that changes may be made in form and detail without departing from the spirit and scope of the invention.

What is claimed is:

1. A multipurpose utility mounting assembly for a handheld field maintenance tool, the assembly comprising:
   a backing plate portion detachably coupleable to a handheld field maintenance tool;
   a hinge portion coupled to the backing plate region; and
   a stand hingedly coupled to the hinge portion to pivot thereabout, the stand having at least a retracted position in which the stand is disposed in a recess in the handheld field maintenance tool, and a hanger position in which the stand extends beyond a top of the handheld field maintenance tool.

2. The assembly of claim 1, wherein the stand has an intermediate position between the retracted position and the hanger position, the intermediate position configured to maintain the handheld field maintenance tool at an angle when placed on a horizontal surface.

3. The assembly of claim 1, and further comprising at least one locking tang disposed to maintain the stand in the hanger position.

4. The assembly of claim 1, wherein the stand includes an elastomeric foot.

5. The assembly of claim 1, wherein the stand includes a shaped portion having a local minima at an end opposite the hinge portion.

6. The assembly of claim 1, and further comprising a stylus therein.

7. The assembly of claim 1, and further comprising a loop portion configured to receive a loop therethrough.

8. The assembly of claim 7, wherein the loop portion is a transverse loop portion.

9. The assembly of claim 7, wherein the loop portion is a longitudinal loop portion.

10. The assembly of claim 9, and further comprising a transverse loop portion configured to receive a transverse loop therethrough.

11. The assembly of claim 1, wherein the backing plate portion includes a plurality of screw holes.

12. The assembly of claim 1, and further comprising a wrist strap loop for mounting a wrist strap thereto.

13. A multipurpose utility mounting assembly for a handheld field maintenance tool, the assembly comprising:
   a backing plate portion detachably coupleable to a handheld field maintenance tool; and
   a loop portion configured to receive a loop therethrough.

14. The assembly of claim 13, wherein the loop portion is a transverse loop portion.

15. The assembly of claim 13, wherein the loop portion is a longitudinal loop portion.

16. The assembly of claim 15, and further comprising a transverse loop portion configured to receive a transverse loop therethrough.

17. The assembly of claim 13, wherein the backing plate portion includes a plurality of screw holes.

18. The assembly of claim 13, and further comprising a wrist strap loop for mounting a wrist strap thereto.

\* \* \* \* \*